US009685482B2

(12) United States Patent
Stevens (10) Patent No.: US 9,685,482 B2
(45) Date of Patent: Jun. 20, 2017

(54) IMAGE SENSOR WITH BURIED-CHANNEL DRAIN (BCD) TRANSISTORS

(71) Applicant: SEMICONDUCTOR COMPONENTS INDUSTRIES, LLC, Phoenix, AZ (US)

(72) Inventor: Eric Stevens, Webster, NY (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/052,574

(22) Filed: Feb. 24, 2016

(65) Prior Publication Data

US 2016/0268335 A1    Sep. 15, 2016

Related U.S. Application Data

(60) Provisional application No. 62/130,083, filed on Mar. 9, 2015.

(51) Int. Cl.
*H01L 27/00* (2006.01)
*H01L 27/148* (2006.01)
(Continued)

(52) U.S. Cl.
CPC .. *H01L 27/14887* (2013.01); *H01L 27/14636* (2013.01); *H01L 27/14643* (2013.01);
(Continued)

(58) Field of Classification Search
CPC .............. H04N 5/378; H01L 27/14643; H01L 27/14689; H01L 27/14636; H01L 29/76816
See application file for complete search history.

(56) References Cited

U.S. PATENT DOCUMENTS 4,394,674 A    7/1983 Sakuma et al.
5,192,990 A *  3/1993 Stevens ............... H01L 29/7838
257/218

(Continued)

OTHER PUBLICATIONS

Izawa et al., "The Impact of N-Drain Length and Gate-Drain/Source Overlap of Submicrometer LDD Devices for VLSI", IEEE Electron Device Letters, vol. EDL-8, No. 10, p. 480-482, Oct. 1987.

(Continued)

*Primary Examiner* — Ngan Ngo
(74) *Attorney, Agent, or Firm* — Treyz Law Group, P.C.; Jason Tsai; Joseph F. Guihan (57) ABSTRACT

A charge-coupled device (CCD) image sensor is provided. The CCD image sensor may include an array of photosensors that transfer charge to multiple vertical CCD shift registers, which then in turn transfer the charge to a horizontal CCD shift register. The horizontal CCD shift register then feeds an output buffer circuit. The output buffer circuit can include a load transistor implemented using a buried-channel drain (BCD) structure. The load transistor may include a gate conductor, a source diffusion region, a drain diffusion region, and a buried-channel drain region that at least partially extends under the gate conductor. The BCD region may be formed before or after the formation of the gate conductor. If desired, the BCD region can also be formed at the source edge. An image sensor configured in this way can exhibit higher source-drain breakdown voltages, enhanced amplifier gain, and reduced amplifier glow.

10 Claims, 7 Drawing Sheets

(51) Int. Cl.
*H01L 27/146* (2006.01)
*H04N 5/378* (2011.01)
*H01L 29/768* (2006.01)

(52) U.S. Cl.
CPC .. *H01L 27/14689* (2013.01); *H01L 27/14837* (2013.01); *H01L 29/76816* (2013.01); *H01L 29/76833* (2013.01); *H04N 5/378* (2013.01)

(56) References Cited

U.S. PATENT DOCUMENTS

| | | | |
|---|---|---|---|
| 5,705,439 | A | 1/1998 | Chang |
| 5,744,371 | A | 4/1998 | Kadosh et al. |
| 6,642,543 | B1 * | 11/2003 | El Gamal ........... H01L 27/0922 257/291 |
| 2005/0248674 | A1 * | 11/2005 | Mabuchi ............. H04N 5/3658 348/308 |
| 2006/0012698 | A1 * | 1/2006 | Nitta ...................... H04N 5/335 348/308 |

OTHER PUBLICATIONS

Izawa et al., "The Impact of Gate-Drain Overlapped LDD (Gold) for Deep Submicron VLSI's", IEDM Tech Digest, Electron Devices Meeting, p. 38-41, Dec. 1987.

Huang et al., "A Novel Submicron LDD Transistor with Inverse-T Gate Structure", IEDM Tech Digest, Electron Devices Meeting, p. 742-745, vol. 32, Dec. 1986.

Yoshida et al., "Hot Carrier Induced Degradation Mode Depending on the LDD Structure in MMOSFETs", IEDM Tech Digest, Electron Device Meeting, p. 42-45, vol. 33, Dec. 1987.

Wen et al., "A Self-Aligned Inverse-T Gate Fully Overlapped LDD Device for Sub-Half Micron CMOS", IEDM Tech Digest, Electron Devices Meeting, IEDM Technical Digest, p. 765-768, Dec. 1989.

Hori, "1/4-μm LATID (Large-Tilt-angle Implanted Drain) Technology for 3.3-V Operation", IEDM Tech Digest, Electron Devices Meeting, IEDM Technical Digest, p. 777-780, Dec. 1989.

Inuishi et al., "A High Performance and Highly Reliable Dual Gate CMOS with Gate/n/sup-/ Overlapped LDD Applicable to the Cyrogenic Operation", IEDM Tech Digest, Electron Devices Meeting, p. 773-776, Dec. 1989.

Pfiester et al., "A Self-Aligned LDD/Channel Implanted ITLDD Process with Selectively-Deposited Poly Gates for CMOS VLSI", IEDM Tech Digest, Electron Devices Meeting, p. 769-772, Dec. 1989.

Matsuoka et al., "Drain Structure Optimization for Highly Reliable Deep Submicron nMOSFET's with 3.3V High Performance Operation in the Scaling Trend", IEDM Tech Digest, Electron Device Meeting, p. 833-836, Dec. 1990.

* cited by examiner

IMAGE SENSOR WITH BURIED-CHANNEL DRAIN (BCD) TRANSISTORS

This application claims the benefit of provisional patent application No. 62/130,083, filed Mar. 9, 2015, which is hereby incorporated by reference herein in its entirety.

BACKGROUND

This relates generally to imaging systems and, more particularly, to charge-coupled device (CCD) imaging systems.

Electronic devices such as cellular telephones, cameras, and computers often include imaging systems that include digital image sensors for capturing images. Image sensors may be formed having a two-dimensional array of image pixels that contain photodiodes that convert incident photons (light) into electrical signals. Electronic devices often include displays for displaying captured image data.

Conventional interline CCD imagers are provided with rows and columns of photodiodes. Each column of photodiodes generate charge that is transferred to a corresponding vertical CCD (VCCD). The charge is then read out from each VCCD to a horizontal CCD (HCCD), where the charge can then fed to an associated output circuit. The output circuit typically includes one or more load transistors in its current sink path. In this configuration, the load transistor in the current sink path will often experience a high voltage drop of up to 10 volts or more across its source-drain terminals. A conventional load transistor with self-aligned n+ source and drains may have a breakdown voltage that is substantially less than the 10 V voltage drop due to high electric fields at the drain, making that transistor unusable in the output circuit. High electric fields at the-drain terminals can also result in light being emitted from the current load transistor, which is manifested as an undesired glow in the final image in the region near the output circuit.

It is within this context that the embodiments herein arise.

DETAILED DESCRIPTION

This is directed towards an enhancement-mode transistor structure having a very lightly-doped buried channel layer formed at the drain end of the gate. This buried channel layer helps reduce the maximum electric field at the gate-to-drain junction and therefore increases the drain-to-source breakdown voltage and reliability. The buried channel layer may be formed via ion implantation either before or after patterning of the gate conductor. Optionally, an oxide spacer may be used to self-align and hold off the heavily doped source-drain layer from the drain edge of the gate. Alternatively, a standard photoresist mask may also be used to hold off the heavily doped source-drain layer from the drain edge of the gate. A transistor of this type is sometimes referred to as a buried-channel drain (BCD) transistor device. In general, both symmetrical and/or asymmetric versions of the BCD transistor may be formed on an image sensor.

Figure 1:
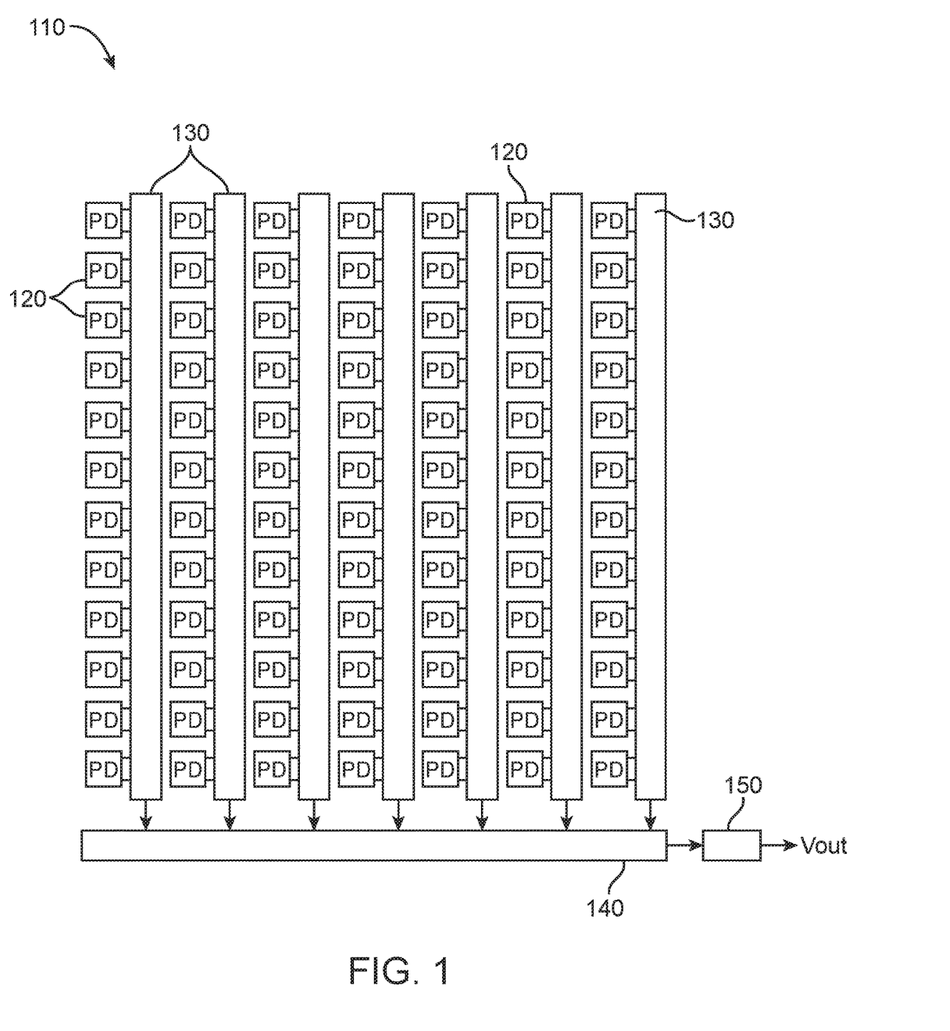
FIG. 1 is a block diagram of a charge-coupled device (CCD) image sensor in accordance with an embodiment.

FIG. 1 is a diagram of the basic configuration of an interline charge-coupled device (CCD) image sensor 110. Image sensor 110 may be integrated into a vehicle safety system (e.g., a rear-view camera or other vehicle safety system), a surveillance system, an electronic device such as a camera, a cellular telephone, a video camera, or any other desired electronic device that captures digital image data. Image sensor 110 may include an array of photosensitive elements such as photodiodes 120 arranged in rows and columns. Photodiodes 120 may each be associated with an image pixel and may be therefore be interchangeably referred to as "pixel photodiodes." Light filtering elements such as color filters, plasmonic light filters, resonance enhanced color filters, or any other filter elements may be formed over each of photodiodes 120. Lens elements such as microlenses may also be formed over photodiodes 120.

Each column of photodiodes 120 in image sensor 110 may be associated with a respective vertical CCD (VCCD) shift register 130. Image sensor 110 may also include a horizontal CCD (HCCD) shift register, which may be coupled to an output amplifier 150. Output amplifier 150 can generate an output signal Vout that is fed to additional image readout and processing circuitry (not shown). In a progressive scan readout mode, every photodiode 120 in each column may simultaneously transfer some or all of the photo-generated charge collected in the photodiode during an image capture mode to their respective VCCD shift registers 130. As an example, some or all of the photo-generated charge from photodiodes 120 in a first column of image sensor 110 may be transferred to a first VCCD shift register 130, while some or all of the photo-generated charge from photodiodes 120 in a second column of image sensor 110 may be transferred to a second VCCD shift register 130 at the same time.

Charge in vertical shift registers 130 may be read out by transferring all columns in parallel, one row at a time, into HCCD shift register 140. As an example, charge associated with every row of all the VCCDs 130 associated with every column in the image sensor may be transferred one row towards the HCCD 140. At the same time, charge associated with the first row of image sensor 110 adjacent to the HCCD 140 is transferred from VCCDs 130 to HCCD 140. Each row of charge will be successively shifted from vertical shift registers 130 into horizontal shift register 140 until the entire array has been read out, and the entire process repeats.

Once HCCD shift register 140 receives charge associated with a given row from VCCD shift registers 130, register 140 may then serially transfer charge to an output circuit such as output buffer (or amplifier) 150. To increase frame rate, output 150 and register 140 may be duplicated at the opposite side or one or more corners of image sensor 110 (e.g., for multi-output read out operations). The duplicate HCCD register may serve the same purpose and may have the same functionality as HCCD shift register 140.

The use of photodiodes in image sensor 110 of FIG. 1 is merely illustrative and does not limit the scope of the present invention. In other suitable arrangements, the image sensor may be interline CCDs, full frame CCDs, time delayed integration (TDI) CCDs, or other suitable types of image sensors that do not necessarily include a separate array of photodiodes.

Figure 2:
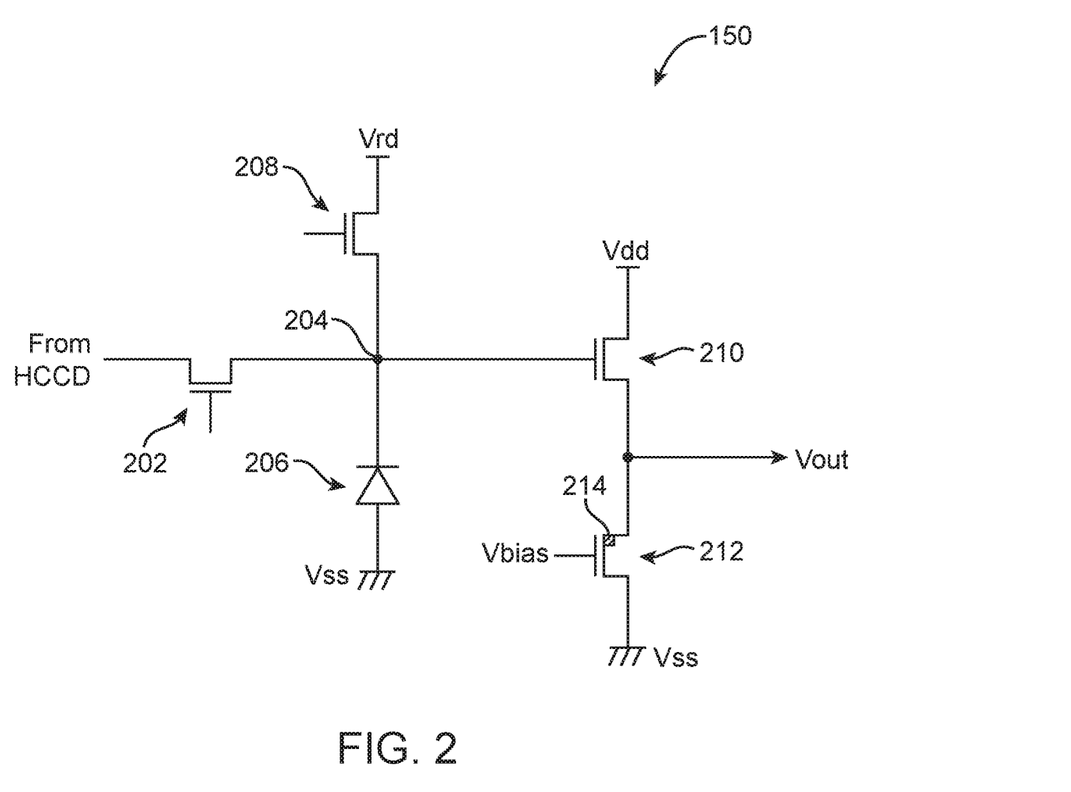
FIG. 2 is a circuit diagram of an illustrative output circuit that includes a buried-channel drain (BCD) transistor in accordance with an embodiment.

FIG. 2 is a circuit diagram of an exemplary output circuit 150. As shown in FIG. 2, output circuit 150 may include output gate transistor 202 electrically coupled between charge-to-voltage conversion region 204 and a horizontal CCD shift register (now shown). Reset transistor 208, floating diffusion diode 206, and a gate of amplifier transistor 210 are also connected to node 204. Charge-to-voltage conversion region 204 and amplifier transistor (sometimes referred to as a driver transistor or source-follower transistor) 210 buffers the voltage on node 204 to output voltage signal Vout. A current sink transistor (sometimes referred to as a load transistor) 212 may be coupled in series with driver transistor 210. Load transistor 212 may have a gate terminal that receives bias voltage Vbias.

As described above in the Background section, the load transistor can sometimes experience a large voltage drop across its source-drain terminals. In order to increase reliability and amplifier gain, and reduce amplifier glow, it may be desirable to increase the transistor drain-to-source breakdown voltage Vbk by reducing the electric field at the drain region of the load transistor. One conventional way of achieving improved breakdown voltage Vbk involves forming a light-doped drain (LDD) structure. Several modifications of the LDD structure include the Inverse T-gate LDD (ITLDD) structure, the gate-drain overlapped LDD (GOLD) structure, the fully overlapped LDD (FOLD) structure, and the large-tilt angle implanted drain (LATID) structure. These conventional approaches, however, require complex processing steps which are typically only suitable for submicron channel-length devices. However, it may be desirable for certain applications to improve the transistor's Vbk in processes where relatively long channel lengths (e.g., channel lengths greater than 1 micron) are used.

In accordance with an embodiment, a buried-channel drain (BCD) transistor structure is provided that reduces the electric field at the drain edge (and therefore can help achieve a large breakdown voltage Vbk and reduce amplifier glow) and that can be fabricated with a simple process suitable for devices with longer channel lengths. Still referred to FIG. 2, load transistor 212 may have a buried-channel drain structure, as indicated by buried channel portion 214.

Figure 3:
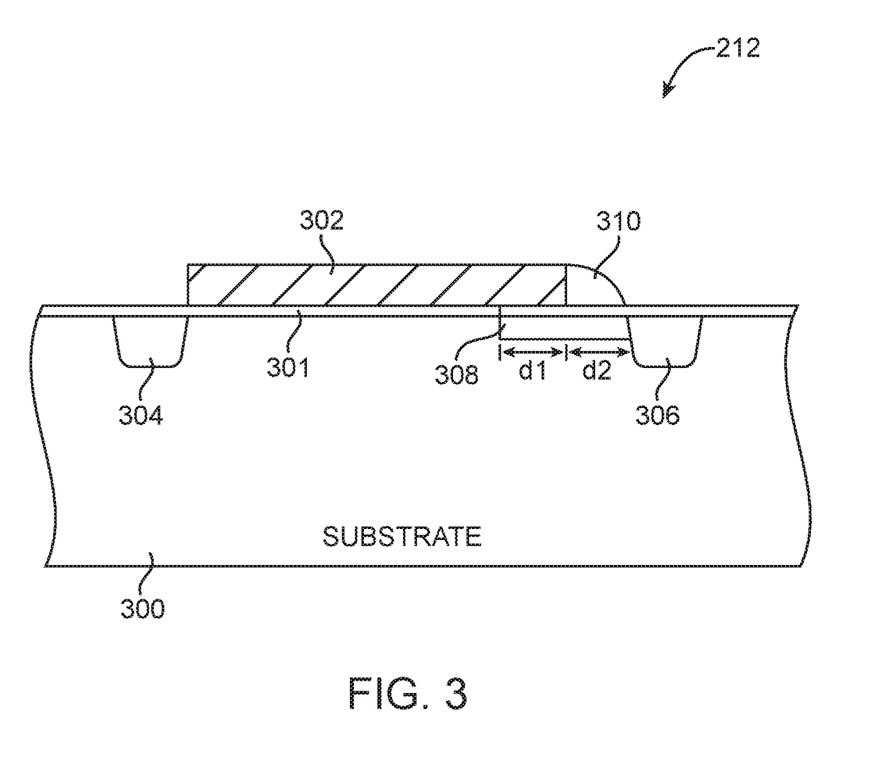
FIG. 3 is a cross-sectional side view of an illustrative buried-channel drain (BCD) transistor in accordance with an embodiment.

FIG. 3 is a cross-sectional side view of BCD load transistor 212. As shown in FIG. 3, transistor 212 may include a gate structure such as gate conductor 302 formed over substrate 300 (e.g., a p-type semiconductor substrate), a gate dielectric such as silicon dioxide layer 301 interposed between gate 302 and the surface of substrate 300, a first diffusion region such as source region 304 formed on one side of gate 302, and a second diffusion region such as drain region 306 formed on the other side of gate 302. In particular, a buried-channel drain (BCD) region such as region 308 may be formed between drain region 306 and gate 302. While drain region 306 may be highly doped (e.g., an n+ doped region), BCD region 308 may be a lightly-doped region (e.g., an n-type doped region) having at least ten times lower dopant concentration than region 306, at least 100 times lower dopant concentration than region 306, at least 1000 times lower dopant concentration than region 306, etc.

Buried-channel region 308 may have a first portion with length d1 that extends directly under gate 302 (e.g., gate 302 and BCD region 308 directly overlap for distance d1) and a second portion with length d2 that is not directly covered by gate 302 (e.g., gate 302 and the second portion of BCD region 308 are non-overlapping). Lengths d1 and d2 may be different or may be equal. A spacer structure such as oxide spacer 310 may be formed by gate 302 directly over the second portion of BCD region 308. Configured in this way, spacer 310 may serve to effectively hold off the n+ drain region 306 from the drain edge of gate 302. The dimensions of spacer 310 can therefore be tuned to adjust distance d2 of region 308. In general, a larger distance d2 can help minimize the electric field at the drain edge, thereby improving drain-to-source breakdown voltage at the expense of increased transistor area.

Figure 4A:
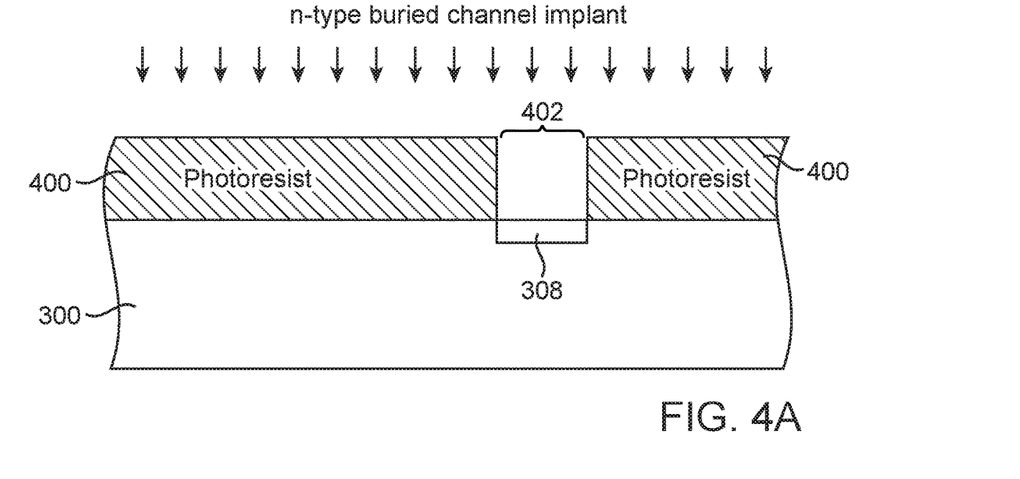
FIG. 4A is a cross-sectional side view showing how a buried channel region can be formed prior to gate formation in accordance with an embodiment.

FIG. 4A is a cross-sectional side view showing how a buried channel region can be formed prior to gate formation in accordance with an embodiment. As shown in FIG. 4A, photoresist 400 may be formed on substrate 300. Thereafter, an n-type buried channel implantation can be performed to form BCD region 308 through an opening 402 in photoresist 400.

Figure 4B:
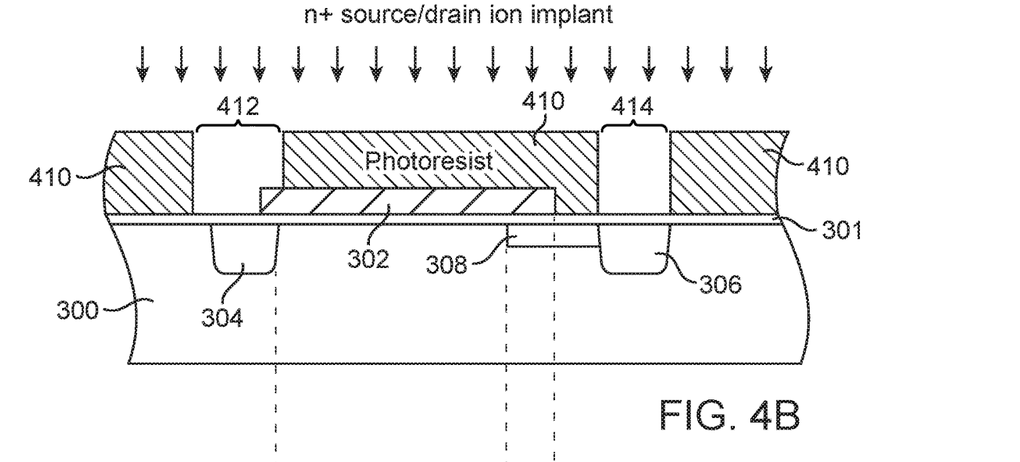
FIG. 4B is a cross-sectional side view showing how source-drain diffusion regions can be formed after gate formation in accordance with an embodiment.

FIG. 4B is a cross-sectional side view showing how source-drain diffusion regions can be formed after gate formation in accordance with an embodiment. As shown in FIG. 4B, additional photoresist 410 may be formed over gate conductor 302 and substrate 300. Thereafter, an n+ source/drain ion implantation can be performed to form source region 304 via opening 412 in photoresist 410 and to form drain region 306 via opening 414 in photoresist 410. While opening 414 has the same footprint as drain region 306, opening 412 may have a footprint that is larger than source region 304.

Figure 4C:
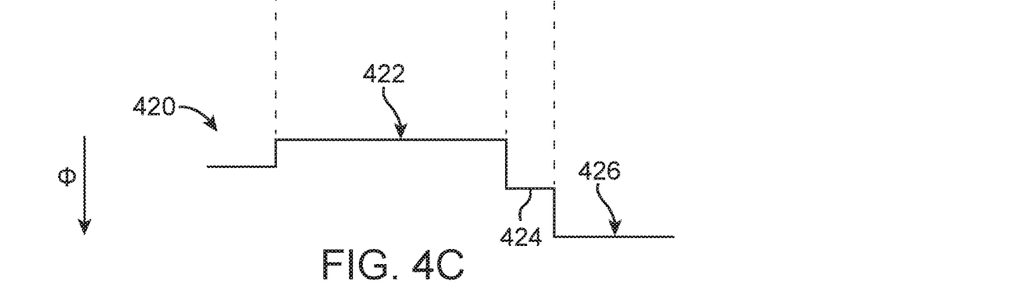
FIG. 4C is a diagram illustrating the potential profile of the channel region of a buried-channel drain (BCD) transistor formed using the steps of FIGS. 4A and 4B in accordance with an embodiment.

FIG. 4C is a diagram illustrating the potential profile of the channel region of a buried-channel drain (BCD) transistor formed using the steps of FIGS. 4A and 4B in accordance with an embodiment. As shown in FIG. 4C, the electric potential 420 exhibits a level 422 in a first portion of the channel region, a level 424 in a second portion of the channel region that is occupied by BCD region 308, and level 426 near the drain region. This step-wise transition from level 422 to level 426 can help further reduce the electric field at the drain edge and increase breakdown voltage Vbk.

Figure 5A:
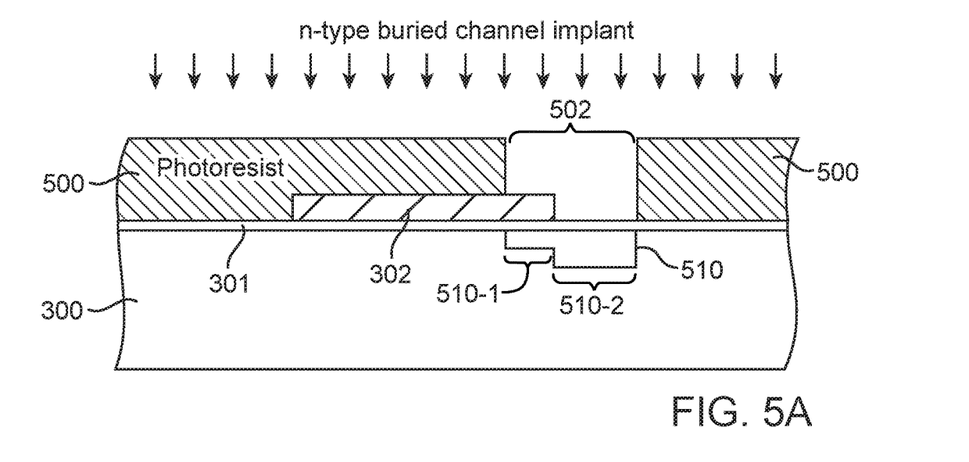
FIG. 5A is a cross-sectional side view showing how a buried channel region can be formed after gate formation in accordance with an embodiment.

FIG. 5A shows another suitable arrangement in which the buried-channel drain region is formed after gate formation. As shown in FIG. 5A, photoresist 500 may be formed over gate structure 302 and over substrate 300. Thereafter, an n-type buried channel implantation can be performed to form BCD region 510 through an opening 502 in photoresist 500. In particular, opening 502 may partially expose gate 302. Configured in this way, BCD region 510 having a first portion 510-1 and a second portion 510-2 may be formed. First BCD portion 510-1 may overlap with gate 302 while second BCD portion 510-2 does not overlap with gate 302. Due to the presence of gate 302, the amount of dopant reaching substrate 300 in portion 510-1 is generally less than that reaching substrate 300 in portion 510-2. This method helps improve the conductance of the region 510-2.

Figure 5B:
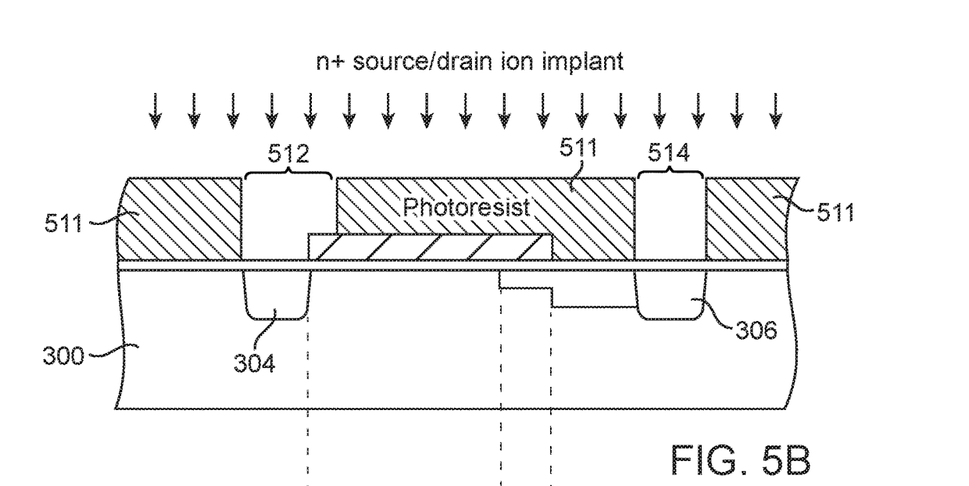
FIG. 5B is a cross-sectional side view showing how source-drain diffusion regions can be formed after the step of FIG. 5A in accordance with an embodiment.

FIG. 5B is a cross-sectional side view showing how source-drain diffusion regions can then be formed after the step shown in FIG. 5A. As shown in FIG. 5B, additional photoresist 511 may be formed over gate conductor 302 and substrate 300. Thereafter, an n+ source/drain ion implantation can be performed to form source region 304 via opening 512 in photoresist 511 and to form drain region 306 via opening 514 in photoresist 511. For example, opening 512 may also partially expose gate 302 at the source edge to help self-align the source diffusion region to the edge of gate 302, (e.g., while opening 514 has the same footprint as drain region 306, opening 512 may have a footprint that is larger than source region 304). Self-alignment of the heavily doped source diffusion of the transistor helps reduce its source resistance and increase its conductance for better performance without impacting amplifier glow.

Figure 5C:
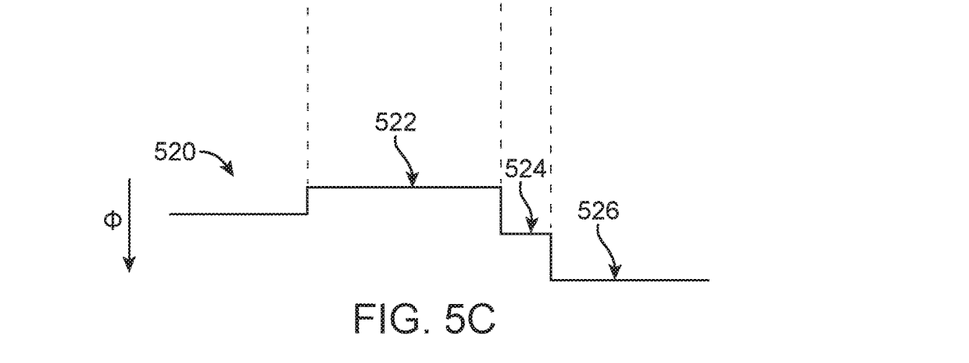
FIG. 5C is a diagram illustrating the potential profile of the channel region of a buried-channel drain (BCD) transistor formed using the steps of FIGS. 5A and 5B in accordance with an embodiment.

FIG. 5C is a diagram illustrating the potential profile of the channel region of a buried-channel drain (BCD) transistor formed using the steps of FIGS. 5A and 5B in accordance with an embodiment. As shown in FIG. 5C, the electric potential 520 exhibits a level 522 in a first portion of the channel region, a level 524 in a second portion of the channel region that is occupied by BCD portion 510-1, and a level 526 corresponding to a portion in substrate 300 that is occupied by BCD portion 510-2 and drain region 306. This step-wise transition from level 522 to level 526 reduces the electric field at the drain edge and increases breakdown voltage Vbk and reduces amplifier glow.

Figure 6:
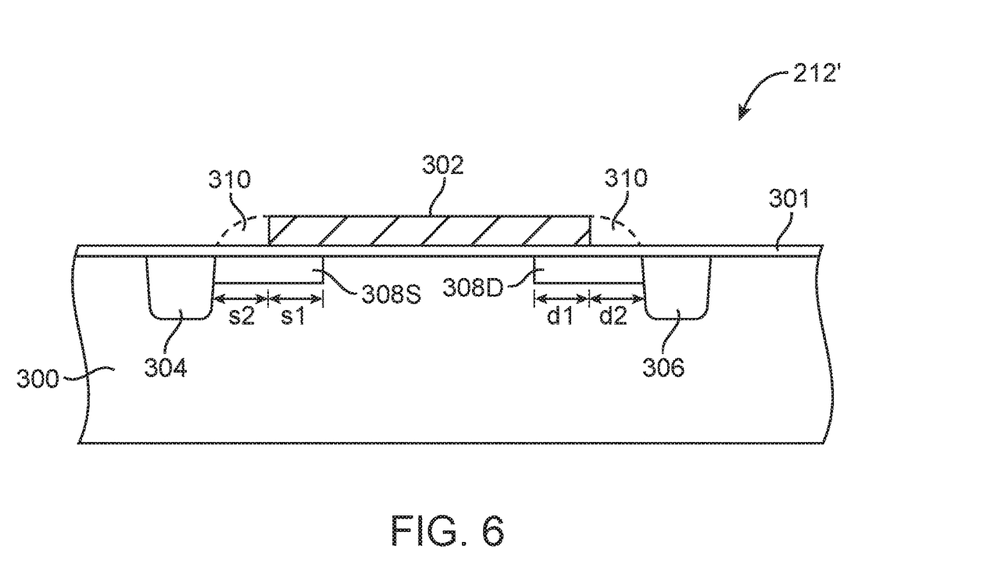
FIG. 6 is a diagram of a symmetric BCD transistor formed using steps similar to those shown in FIGS. 4A-4C in accordance with an embodiment.

FIG. 6 is a diagram of a symmetric BCD transistor 212' formed using steps similar to those shown in FIGS. 4A-4C in accordance with an embodiment (e.g., an additional opening in photoresist 400 may be formed for the buried-channel source region). As shown in FIG. 6, transistor 212' may include a first buried-channel region 308S (sometimes referred to as a buried-channel source region) at the source edge and a second buried-channel region 308D at the drain edge. Buried-channel source region 308S may have a first portion with length s1 that overlaps with gate 302 and a second portion with length s2 that does not overlap with gate 302. Lengths s1 and s2 may be different or may be equal. Similarly, region 308D may have a first portion with length d1 that overlaps with gate 302 and a second portion with length d2 that does not overlap with gate 302. Spacer structures 310 can optionally be portion over the second portions of regions 308S and 308D.

Figure 7:
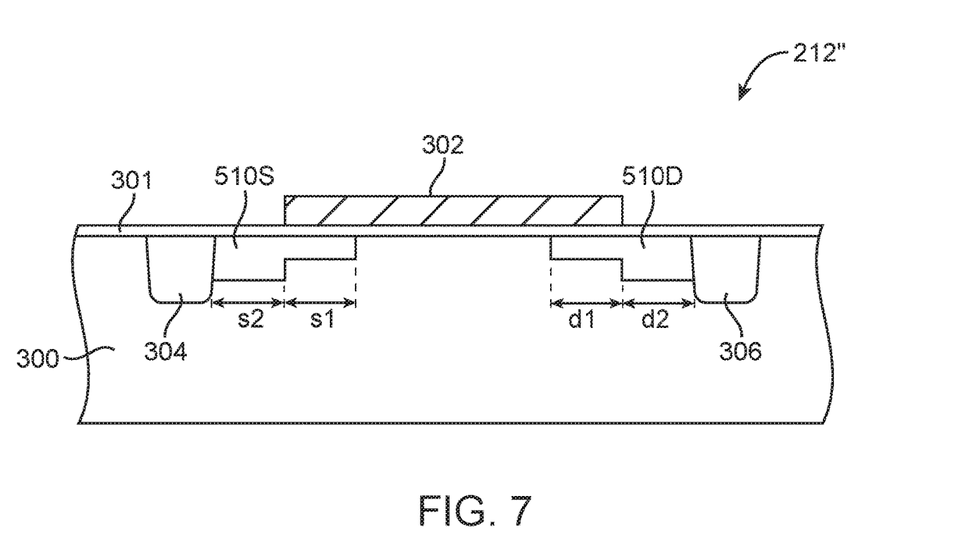
FIG. 7 is a diagram of a symmetric BCD transistor formed using steps similar to those shown in FIGS. 5A-5C in accordance with an embodiment.

FIG. 7 is a diagram of a symmetric BCD transistor 212" formed using steps similar to those shown in FIGS. 5A-5C in accordance with another embodiment (e.g., an additional opening in photoresist 500 may be formed for the buried-channel source region). As shown in FIG. 7, transistor 212" may include a first buried-channel region 510S at the source edge and a second buried-channel region 510D at the drain edge. Region 510S may have a first portion with length s1 that overlaps with gate 302 and a second portion with length s2 that does not overlap with gate 302. Lengths s1 and s2 may be different or may be equal. Similarly, region 510D may have a first portion with length d1 that overlaps with gate 302 and a second portion with length d2 that does not overlap with gate 302. The first and second portions of regions 510S and 510D may have different dopant concentrations, as indicated by the step-wise gradient of buried channel regions.

Figure 8:
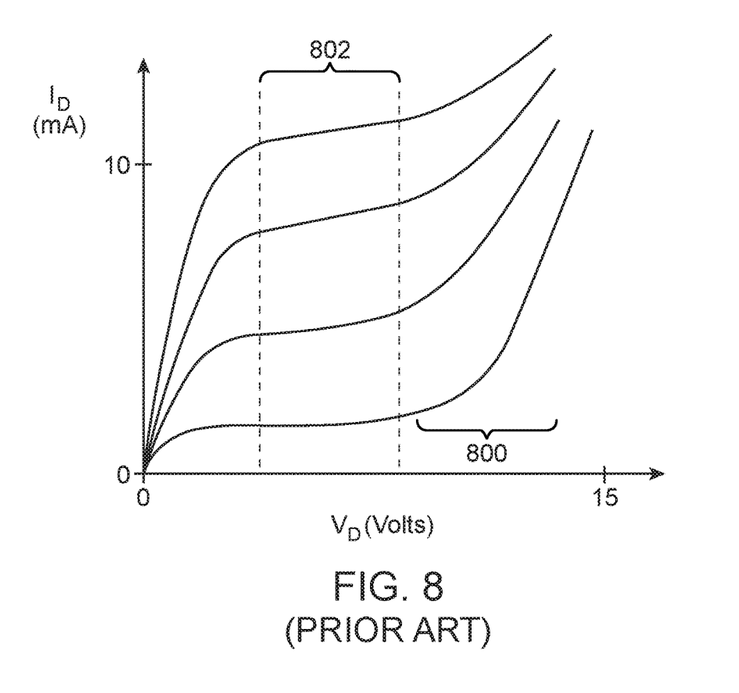
FIG. 8 is a plot of current-voltage curves illustrating the performance of a conventional current sink transistor.

FIG. 8 is a plot of current-voltage curves illustrating the performance of a conventional current sink transistor. In particular, FIG. 8 plots the drain current $I_D$ as a function of drain voltage $V_D$. The different curves of FIG. 8 correspond to different gate-to-source bias voltage levels. As shown in FIG. 8, the curves suffer from channel-length modulation (i.e., a non-zero slope in region 802) and also suffers from voltage breakdown near around 10 V (see, e.g., breakdown current in region 800).

Figure 9:
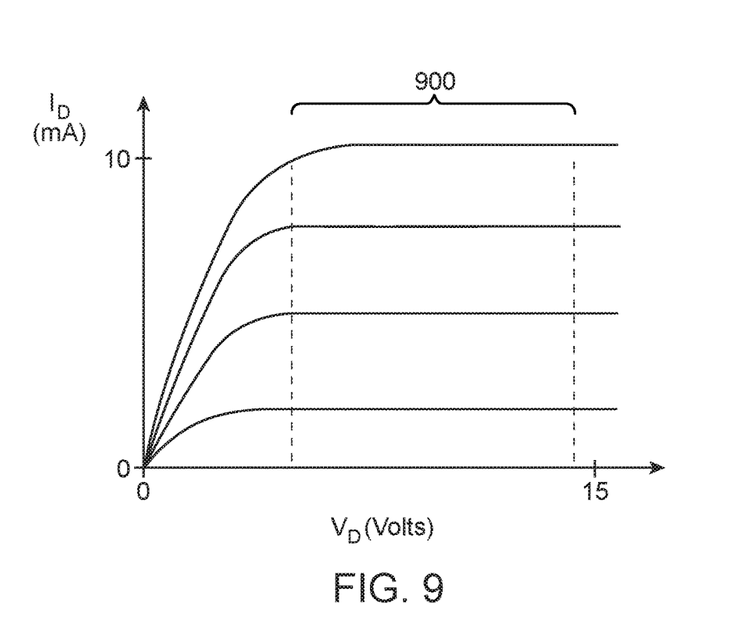
FIG. 9 is a plot of current-voltage curves illustrating the performance of an illustrative load transistor in accordance with an embodiment.

FIG. 9 is a plot of current-voltage curves illustrating the performance of an illustrative BCD load transistor in accordance with an embodiment. As shown in FIG. 9, the curves have a much smaller slope in region 900 and therefore exhibits improved small signal drain-to-source conductance, $g_{DS}$. Moreover, the curves do not exhibit voltage breakdown even at drain voltages of 15 V.

The foregoing embodiments in which the source-drain regions are n-type regions formed in a p-type substrate is merely illustrative and are not intended to limit the scope of the present invention. If desired, the doping type can be switched (e.g., from n-type to p-type, and vice versa) without departing from the spirit of the present invention. Additionally, although these embodiments are shown for enhancement-mode devices, depletion-mode devices could also be made and are within the scope of the present invention. Also, although the output amplifier is shown formed by just a single-stage source follower, this is just for illustration purposes, whereas multiple stage source follower configurations are of also possible.

Various embodiments have been described illustrating CCD image sensors. CCD image sensors having output buffer circuits with buried-channel drain (BCD) load transistors may be used in an imaging system such as an electronic device.

In accordance with an embodiment, an image sensor is provided that includes a plurality of photosensitive elements, a plurality of vertical shift registers that receives charge from the plurality of photosensitive elements, a horizontal shift register that receives the charge from the plurality of vertical shift registers, and an output buffer circuit that receives the charge from the horizontal shift register. The output buffer may include a load transistor having a gate conductor and a buried-channel drain region that extends beneath the gate conductor. The gate conductor of the load transistor may receive a fixed bias voltage signal. The output buffer circuit may also include a source-follow transistor coupled in series with the load transistor, and wherein the gate conductor of the load transistor receives a fixed bias.

The gate conductor may overlap with at least a portion of the buried-channel region. In particular, the buried-channel drain region has a first portion that is covered by the gate conductor and a second portion that is not covered by the gate conductor. The first and second portions may have different dopant concentrations or identical dopant profiles. The load transistor may have an asymmetric transistor structure or a symmetrical transistor structure.

In accordance with one variation, a method for forming the load transistor may include forming the gate conductor after forming the buried-channel drain region. In accordance with another variation, a method for forming the load transistor may include forming the gate conductor before forming the buried-channel drain region. In some embodiments, the method may also include forming a buried-channel source region to form a symmetric buried-channel transistors. An image sensor formed in this way can exhibit increase reliability (e.g., reduced electric field at the drain edge of the load transistor and therefore improved breakdown voltage) and amplifier gain (e.g., improved small-signal drain-to-source conductance of the load transistor) and reduced amplifier glow.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
photosensitive elements that generate charge; and
an output buffer circuit that receives the charge from the photosensitive elements and that includes a load transistor, wherein the load transistor includes a gate conductor and a buried-channel drain region that extends partially beneath only a portion of the gate conductor.

2. The image sensor of claim 1, wherein the output buffer circuit includes a source-follow transistor coupled in series with the load transistor, and wherein the gate conductor of the load transistor receives a fixed bias voltage signal.

3. The image sensor of claim 1, wherein the gate conductor overlaps with at least a portion of the buried-channel drain region.

4. The image sensor of claim 1, wherein the buried-channel drain region has a first portion that is covered by the gate conductor and a second portion that is not covered by the gate conductor.

5. The image sensor of claim 4, wherein the first and second portions of the buried-channel region have different lengths.

6. The image sensor of claim 4, wherein the first and second portions of the buried-channel region have identical lengths.

7. The image sensor of claim 4, wherein the first and second portions of the buried-channel region have different dopant concentrations.

8. The image sensor of claim 4, wherein the first and second portions of the buried-channel region have identical dopant profiles.

9. The image sensor of claim 1, wherein the load transistor has a symmetrical source and drain transistor structure.

10. The image sensor of claim 1, wherein the load transistor has an asymmetric source and drain transistor structure.

* * * * *